United States Patent

Hayano et al.

Patent Number: 5,497,088
Date of Patent: Mar. 5, 1996

[54] MRI IMAGING METHOD AND APPARATUS

[75] Inventors: Yuichi Hayano; Susumu Kosugi, both of Tokyo, Japan

[73] Assignee: GE Yokogawa Medical Systems, Limited, Tokyo, Japan

[21] Appl. No.: 318,800

[22] PCT Filed: May 17, 1993

[86] PCT No.: PCT/JP93/00645

§ 371 Date: Oct. 14, 1994

§ 102(e) Date: Oct. 14, 1994

[87] PCT Pub. No.: WO93/22967

PCT Pub. Date: Nov. 25, 1993

[30] Foreign Application Priority Data

May 20, 1992 [JP] Japan .................................... 4-127142

[51] Int. Cl.⁶ ...................................................... G01V 3/14
[52] U.S. Cl. ............................................ 324/309; 324/307

[58] Field of Search ...................... 324/300, 307, 324/309, 311, 312, 318

[56] References Cited

U.S. PATENT DOCUMENTS 4,684,893   8/1987   Kojima et al. .................. 324/309 X

*Primary Examiner*—Sandra L. O'Shea
*Assistant Examiner*—Mack Haynes
*Attorney, Agent, or Firm*—Moonray Kojima

[57] ABSTRACT

An object of the present invention is to eliminate the bad effect on the image quality caused by the production of a sharp difference in signal strength at the DC view due to the T2 relaxation and to prevent the contrast of the MRI image from becoming a mixture of different multiple contrasts. The DC view is shifted to become a view virtually in the middle of one block by adding an offset phase gradient amount to each phase gradient and, further, the low-frequency region is arranged to be contained in one block.

4 Claims, 5 Drawing Sheets

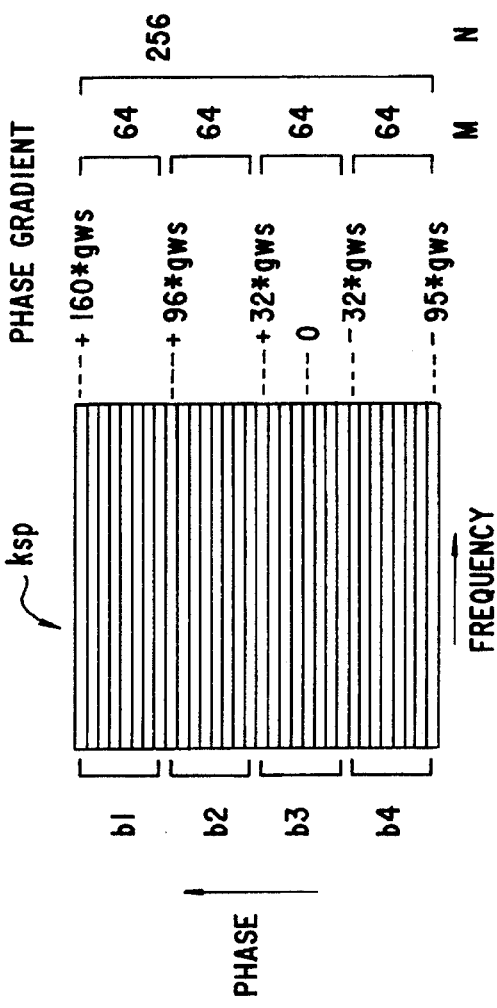
FIG.2
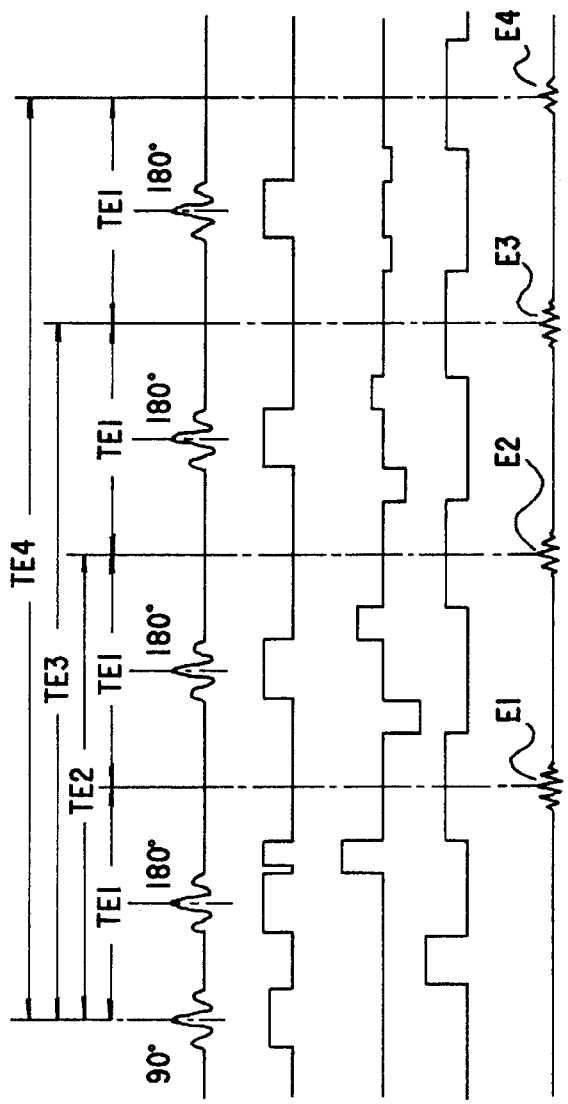
FIG.3A
FIG.3B
FIG.3C
FIG.3D
FIG.3E

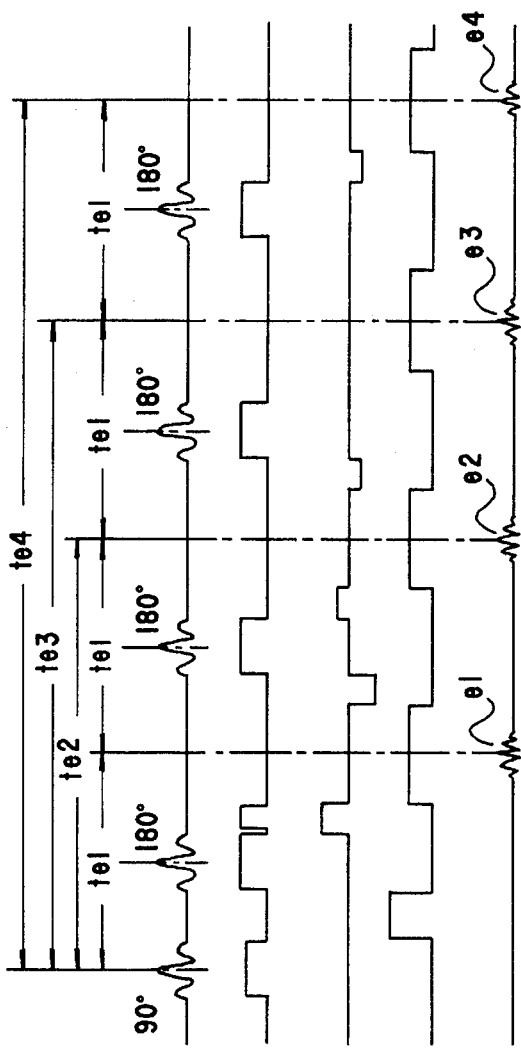
FIG.8A
FIG.8B
FIG.8C
FIG.8D
FIG.8E
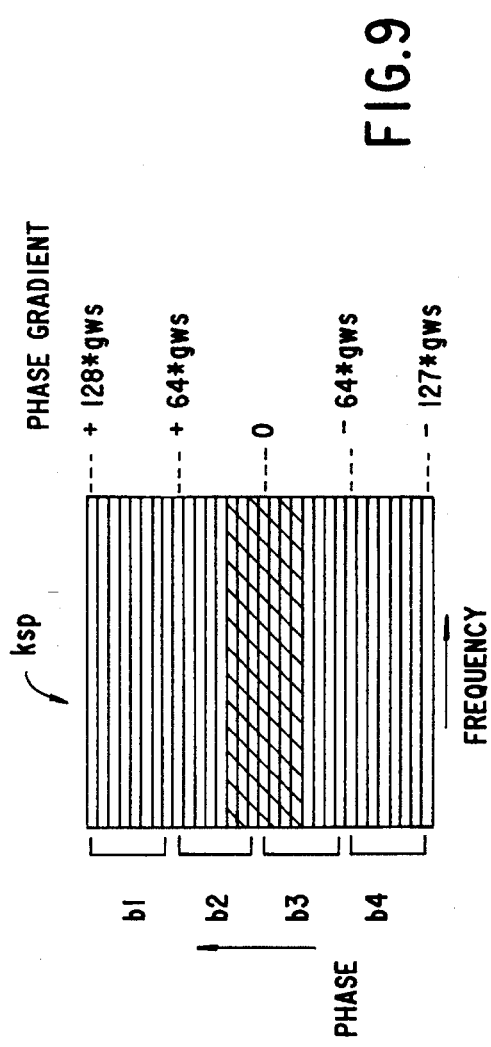
FIG.9

1

MRI IMAGING METHOD AND APPARATUS

TECHNICAL FIELD

The present invention relates to an MRI imaging method and apparatus and, more particularly, to an improvement in an MRI imaging method and apparatus using multiple echoes for betterment of image quality.

BACKGROUND ART

As a prior art MRI imaging method, that of using multiple echoes is known.

FIG. 7 is a diagram explanatory of an example of prior art MRI imaging methods using multiple echoes. The k-space ksp is constituted of 256 (=N) views. The views are each associated with the phase from −127*gws to +128*gws (gws is the gradient amount for 1 warp step). The k-space ksp is divided into 4 (=S) blocks b1, b2, b3, and b4, with each block formed of successive 64 (=M) views. For the multiple echoes of the first order to the fourth order for the first time, data of the echoes are collected by applying a large phase gradient to the first positive side of the respective blocks b1, b2, b3, and b4. For the multiple echoes of the first order to the fourth order for the second time, data of the echoes are collected by applying a large phase gradient to the second positive side of the respective blocks b1, b2, b3, and b4. For the multiple echoes of the first order to the fourth order for the ith time, in general, data of the echoes are collected by applying a large phase gradient to the ith positive side of the respective blocks b1, b2, b3, and b4. By repeating the above operation up to the 64th time, data for 256 (=4×64) views of the k-space ksp are collected.

FIGS. 8A–8E are pulse sequence diagrams depicting a spin echo method for collecting data for the multiple echoes of the first order to the fourth order for the first time. The echo e1 of the first order provides the data of the view corresponding to the phase on the most positive side in the block b1 (phase gradient =+128*gws). The echo e2 of the second order provides the data of the view corresponding to the phase on the most positive side in the block b2 (phase gradient =+64*gws). The echo e3 of the third order provides the data of the view corresponding to the phase on the most positive side in the block b3 (phase gradient=0*gws). The echo e4 of the fourth order provides the data of the view corresponding to the phase on the most positive side in the block b4 (phase gradient =−64*gws).

In FIGS. 8A–8E, FIG. 8A shows RF pulses; FIG. 8B shows the slice axis; FIG. 8C shows the warp axis; FIG. 8D shows the read axis; and FIG. 8E shows the echoes.

In the above described prior art MRI imaging method, however, the DC view (phase gradient =0*gws) is located on the boundary line between the block b2 and the block b3 as shown in FIG. 9. Further, the low-frequency region (the hatched portion in FIG. 9) stretches over both the block b2 and the block b3. Namely, the second order echo e2 and the third order echo e3 have different signal strengths because of the T2 relaxation due to the time difference between the echo time te2 and the echo time te3, and hence, when the DC view is located on the boundary line between the block b2 and the block b3, a problem arises that a sharp difference in signal strength is produced at the DC view and the image quality is thereby deteriorated. Further, since the low-frequency region determines the contrast of the MRI image, when the data of the low-frequency region stretches over both the block b2 and the block b3 providing different contrasts, there arises a problem that the contrast of the MRI image becomes that in which the contrast in the block b2 and the contrast in the block b3 are mixed.

DISCLOSURE OF THE INVENTION

Accordingly, an object of the present invention is to provide an MRI imaging method and apparatus in which the bad effect on the image quality by the production of a sharp difference in signal strength due to the T2 relaxation at the DC view is eliminated and, further, the contrast of the MRI image is prevented from becoming a mixture of different multiple contrasts.

According to a first aspect, the present invention, in an MRI imaging method in which N views constituting a k-space is divided into blocks of an even number S, with each block formed of successive M views, collection of multiple echoes of the first order to the Sth order is repeated from the first time up to the Mth time, while providing phase gradients such that the phases corresponding to the different blocks are encoded for the first order to the Sth order, respectively, and such that the phases corresponding to different views in each block are encoded for the first time to the Mth time, and thereby data of the N (=S×M) views constituting the k-space are collected, is characterized in its constitution by that an offset phase gradient amount allowing the DC view to become a view virtually in the middle of one block is added to each phase gradient.

In the MRI imaging method of the invention, the offset phase gradient amount is added to each phase gradient allowing the DC view to become a view virtually in the middle of one block. Then, the low-frequency region comes to be contained in one block. Namely, since the DC view does not lie on the boundary line between two blocks, the bad effect on the image quality due to production of a sharp difference in signal strength at the DC view can be eliminated. Further, since the low-frequency region comes to be contained in one block, the contrast of the MRI image can be prevented from becoming a mixture of different multiple contrasts.

According to a second aspect, the present invention, in an MRI imaging apparatus, is characterized in its constitution by that it comprises sequence control means for controlling gradient magnetic field coils and an RF pulse transmission coil so that the predetermined sequence is attained to add the offset phase gradient amount to each phase gradient to allow the DC view to become a view virtually in the middle of one block.

BRIEF DESCRIPTION OF THE DRAWINGS

FIG. 2 is a diagram explanatory of an embodiment of the MRI imaging method of the invention.

FIGS. 3A–3E are diagrams illustrating a pulse sequence related to the embodiment of FIG. 2.

FIGS. 8A–8E are diagrams illustrating a pulse sequence related to the prior art example of FIG. 7.

FIG. 9 is a diagram explanatory of problems in the prior art example of FIG. 7.

BEST MODE FOR CARRYING OUT THE INVENTION

The present invention will be described below on the basis of embodiments shown in the accompanying drawings. The invention is not limited by such embodiments.

Figure 1:
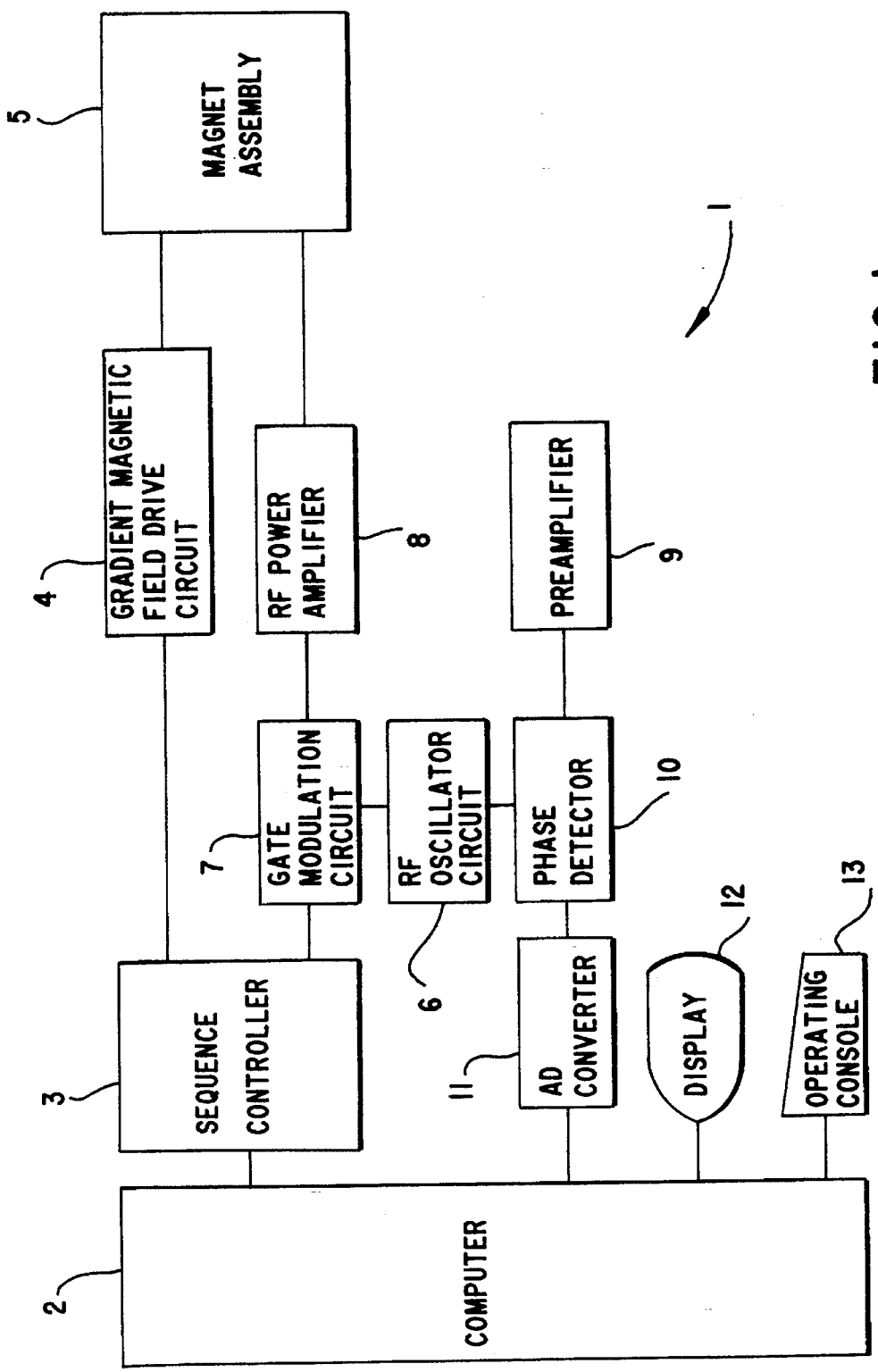
FIG. 1 is a block diagram showing an example of an MRI imaging apparatus for carrying out an MRI imaging method of the invention.

FIG. 1 is a block diagram showing an MRI imaging apparatus 1 for carrying out the MRI imaging method of the invention. A magnet assembly 5 in which an inspected body is received comprises a static magnetic field coil of a superconductivity type or the like for generating a high-intensity static magnetic field to be applied to the inspected body, three gradient magnetic field coils for generating gradient magnetic fields along X, Y, and Z axes, a transmission coil for excitation, and a reception coil for signal collection. A static magnetic field is constantly generated by the static magnetic field coil. A computer 2 controls overall operations under instructions from an operating console 13. A sequence controller 3 on the basis of sequences stored therein operates a gradient magnetic field drive circuit 4 so that gradient magnetic fields are generated by the gradient magnetic field coils of the magnet assembly 5. It further controls a gate modulation circuit 7 so that an RF pulse generated in an RF oscillator circuit 6 is modulated into a predetermined waveform and applied to a transmission coil of the magnet assembly 5 through an RF power amplifier 8. NMR signals obtained by the reception coil of the magnet assembly 5 are inputted to a phase detector 10 through a preamplifier 9 and, then, inputted to the computer 2 through an AD converter 11. The computer 2 reconstructs an image on the basis of the data of the NMR signals received from the AD converter 11 and displays the image on a display 12. The MRI imaging method of the invention is executed following steps of procedures stored in the computer 2 and the sequence controller 3.

FIG. 2 is a diagram explanatory of an embodiment of the MRI imaging method of the invention. The k-space ksp is constituted of 256 (=N) views. The views are each associated with the phases from −95*gws to +160*gws (gws is the gradient amount for 1 warp step). More specifically, while the views were originally associated with the phases from −127*gws to +128*gws, they have come to be associated with the phases from −95*gws to 160*gws as the result of addition of an offset phase gradient amount +32*gws to each phase. Here, the k-space ksp is divided into 4 (=S) blocks b1, b2, b3, and b4, with each block formed of successive 64 (=M) views. For the multiple echoes of the first order to the fourth order for the first time, data of the echoes are collected by applying a large phase gradient to the first positive side of the respective blocks b1, b2, b3, and b4. For the multiple echoes of the first order to the fourth order for the second time, data of the echoes are collected by applying a large phase gradient to the second positive side of the respective blocks b1, b2, b3, and b4. For the multiple echoes of the first order to the fourth order for the ith time, in general, data of the echoes are collected by applying a large phase gradient to the ith positive side of the respective blocks b1, b2, b3, and b4. By repeating the above operation up to the 64th time, data for 256 (=4×64) views of the k-space ksp are collected.

FIGS. 3A–3E are pulse sequence diagrams showing a spin echo method for collecting data for the multiple echoes of the first order to the fourth order for the first time. The echo E1 of the first order provides the data of the view corresponding to the phase on the most positive side in the block b1 (phase gradient =+160*gws). The echo E2 of the second order provides the data of the view corresponding to the phase on the most positive side in the block b2 (phase gradient =+96*gws). The echo E3 of the third order provides the data of the view corresponding to the phase on the most positive side in the block b3 (phase gradient=+32*gws). The echo E4 of the fourth order provides the data of the view corresponding to the phase on the most positive side in the block b4 (phase gradient =−32*gws).

In FIGS. 3A–3E, FIG. 3A shows RF pulses; FIG. 3B shows the slice axis; FIG. 3C shows the warp axis; FIG. 3D shows the read axis; and FIG. 3E shows the echoes.

Figure 4:
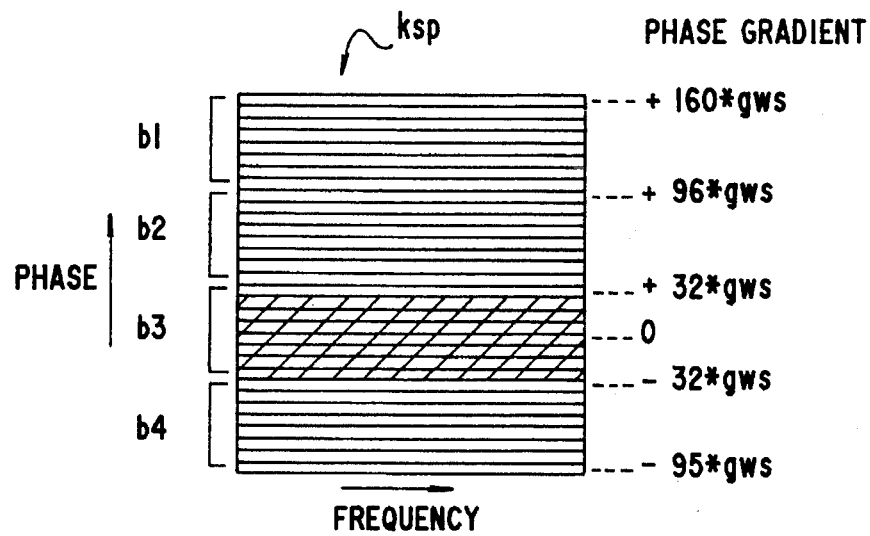
FIG. 4 is a diagram explanatory of effects of the embodiment of FIG. 2.

In the above described MRI imaging method, the DC view (phase gradient=0*gws) is located in the middle of the block b3 as shown in FIG. 4. Further, the low-frequency region (the hatched portion in FIG. 4) is contained in the block b3. Accordingly, occurrence of a sharp difference in signal strength at the DC view can be prevented and, hence, the image quality is prevented from being adversely affected. Further, the contrast of the MRI image comes to be determined by the contrast in the block 3 and, hence, the contrast is prevented from becoming a mixture of different contrasts.

Figure 5:
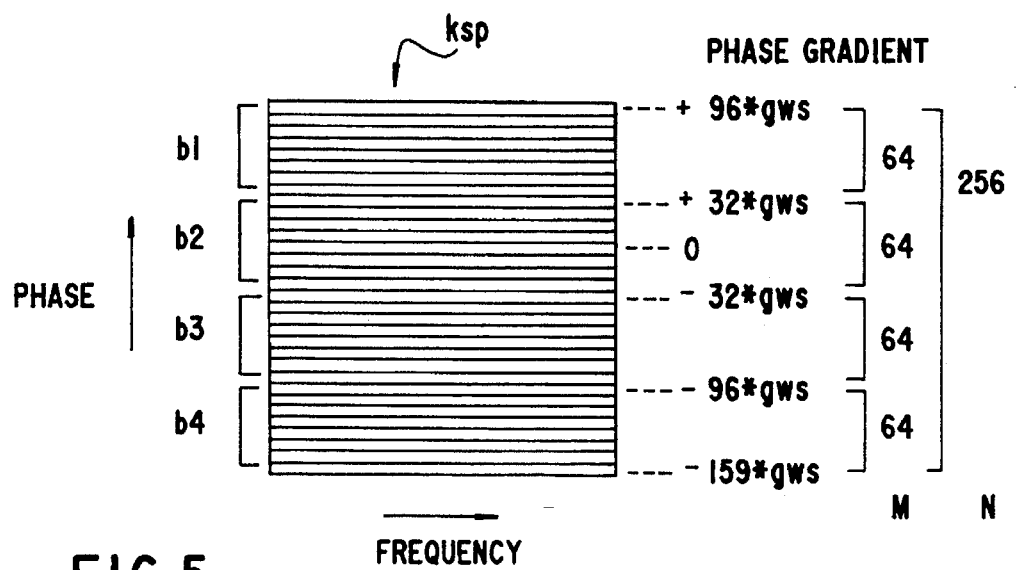
FIG. 5 is a diagram explanatory of another embodiment of the MRI imaging method of the invention.

FIG. 5 is a diagram explanatory of another embodiment of the MRI imaging method of the invention. Each view is associated with the phase from −159*gws to +96*gws. These phases have been obtained by adding an offset phase gradient amount of −32*gws to the original phases being from −127*gws to +128*gws. The k-space ksp is divided into 4 (=S) blocks b1, b2, b3, and b4, with each block formed of successive 64 (=M) views. For the multiple echoes of the first order to the fourth order for the ith time, data of the echoes are collected by applying a large phase gradient to the ith positive side of the respective blocks b1, b2, b3, and b4. Such operation is repeated up to the 64th time and, thereby, data for 256 (=4×64) views of the k-space ksp are collected.

Figure 6:
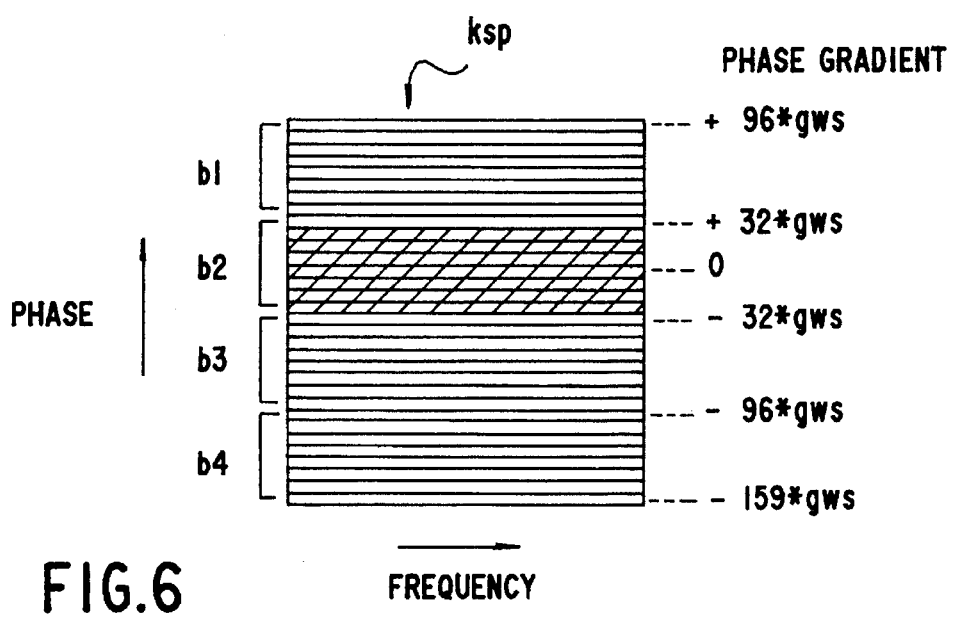
FIG. 6 is a diagram explanatory of effects of the embodiment of FIG. 5.
Figure 7:
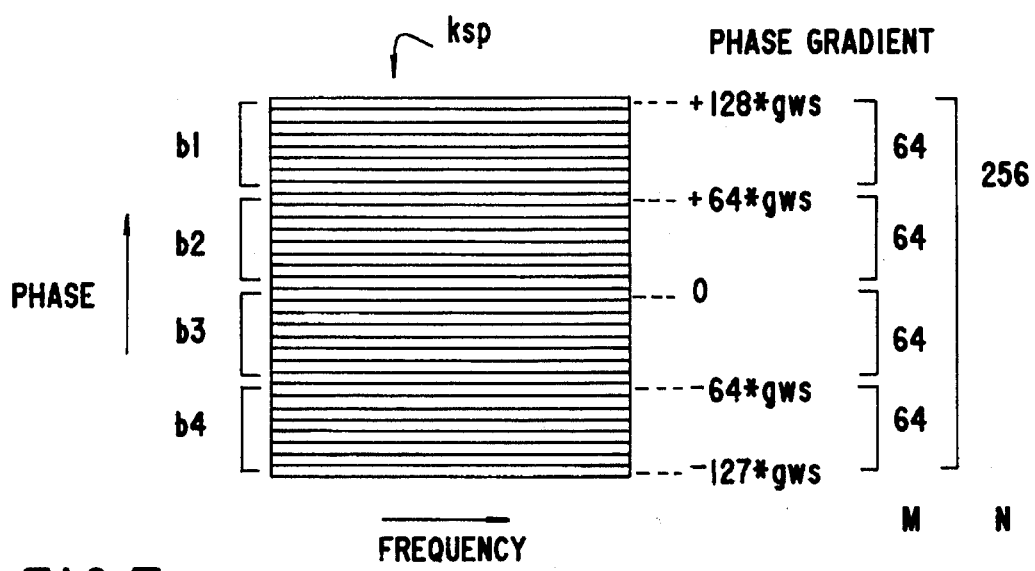
FIG. 7 is a diagram explanatory of a an example of prior art MRI imaging method.

In the above described MRI imaging method, the DC view (phase gradient=0*gws) is located in the middle of the block b2 as shown in FIG. 6. Further, the low-frequency region (the hatched portion in FIG. 6) is contained in the block b2. Accordingly, occurrence of a sharp difference in signal strength at the DC view can be prevented and, hence, the image quality is prevented from being adversely affected. Further, the contrast of the MRI image comes to be determined by the contrast in the block 2 and, hence, the contrast is prevented from becoming a mixture of different contrasts. Further, as apparent from the above described two embodiments (namely, from the fact that the contrast of the MRI image is determined by the contrast of the block b3 in FIG. 4 and that the contrast of the MRI image is determined by the contrast of the block b2 in FIG. 6), MRI images with different contrasts can be obtained by changing the offset phase gradient amount.

Although the k-space ksp was divided into four blocks in the above embodiments, it can be divided into any even number of blocks. Although the obtained data in the above embodiments become asymmetrical about the DC view and it becomes a cause of deterioration in the image quality when the number of blocks is small, the deterioration can be avoided by the use, in combination, of such an image reconstructing method as taking complex conjugate of data to thereby generate data becoming symmetrical about the DC view. For example, data corresponding to the phases from −96*gws to −159*gws are generated by taking the complex conjugate of the data corresponding to the phases from +97*gws to +160*gws in FIG. 2 and, thereafter, image reconstruction is carried out. While the pulse sequence utilizing the multiple echo method of the SE system was used in the above embodiments, the invention can also be applied to the case where the pulse sequence utilizing the multiple echo method of the IR system is used.

According to the MRI imaging method of the invention, bad effect on the image quality produced at the DC view by a sharp change in signal strength due to T2 relaxation can be eliminated. Further, the contrast of the MRI image is prevented from becoming a mixture of different contrasts. As a consequence of the foregoing, good image quality can be obtained.

We claim:

1. In an MRI imaging method using multiple echoes, wherein N views constituting K space are divided into an even number S of blocks, each block being formed of successive M views including a DC view;

collecting multiple echoes of a first order to an Sth order and assigning successive echoes to successive blocks;

repeating said collecting and assigning of said successive multiple echoes to successive blocks for each of said successive M views;

providing phase gradients so that phases corresponding to different blocks are encoded for the first order to the Sth order, and so that phases corresponding to different view in each block are encoded for the first time to the Mth time; and processing data of said N views to obtain a reconstructed image; the improvement comprising providing an offset to each phase gradient so that the phase encoded gradient representing the DC view is disposed away from a boundary between adjacent blocks and substantially in the middle of one of said blocks.

2. The method of claim 1, wherein a complex conjugate of data is used to reconstruct said image.

3. In an MRI imaging apparatus comprising:

a static magnetic field coil for generating a static magnetic field:

gradient magnetic field coils for generating gradient magnetic fields;

an RF pulse transmission coil for generating an RF pulse to cause an RF phenomenon;

an NMR signal reception coil for receiving NMR signals;

control means for controlling said gradient magnetic field coils and RF transmission coil to apply fields and to control said reception coil to receive NMR signals in such a manner that N views constituting K space are divided into an even number S of blocks, each block being formed of successive M views including a DC view; said control means comprising means for collecting multiple echoes of a first order to an Sth order and assigning successive echoes to successive blocks;

means for repeating said collecting and assigning of said successive multiple echoes to successive blocks for each of said successive M views; and means for providing phase gradients so that phases corresponding to different blocks are encoded for the first order to the Sth order, and so that phases corresponding to different views in each block are encoded for the first time to the Mth time; and image reconstruction means for processing data of said N views collected and assigned to said blocks and phase encoded to produce a reconstructed image; the improvement comprising means for adding an offset phase gradient to each phase gradient so that said DC view is disposed away from a boundary between two adjacent blocks and substantially in the middle of one of said blocks.

4. The apparatus of claim 3, wherein said image reconstruction means comprises means for taking a complex conjugate of said data to produce said reconstructed image.

* * * * *